(12) United States Patent
Kanda et al.

(10) Patent No.: US 8,755,246 B2
(45) Date of Patent: Jun. 17, 2014

(54) SEMICONDUCTOR MEMORY DEVICE AND METHOD OF SETTING OPERATION ENVIRONMENT THEREIN

(75) Inventors: Kazushige Kanda, Kawasaki (JP); Toshihiro Suzuki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 138 days.

(21) Appl. No.: 13/423,608

(22) Filed: Mar. 19, 2012

(65) Prior Publication Data

US 2012/0243365 A1 Sep. 27, 2012

(30) Foreign Application Priority Data

Mar. 24, 2011 (JP) .................................. 2011-065972

(51) Int. Cl.
*G11C 8/00* (2006.01)
(52) U.S. Cl.
USPC .................................. 365/230.06; 365/185.17
(58) Field of Classification Search
USPC ......................................... 365/230.06, 185.17
See application file for complete search history.

(56) References Cited

U.S. PATENT DOCUMENTS

| 7,382,675 | B2 | 6/2008 | Kanda |
| 2002/0105845 | A1* | 8/2002 | Hidaka .......................... 365/222 |
| 2008/0162788 | A1 | 7/2008 | Yu |
| 2009/0089490 | A1 | 4/2009 | Ozawa et al. |

FOREIGN PATENT DOCUMENTS

| JP | 2008-165799 | 7/2008 |
| JP | 2009-99112 | 5/2009 |

* cited by examiner

*Primary Examiner* — Huan Hoang
(74) *Attorney, Agent, or Firm* — Oblon, Spivak, McClelland, Maier & Neustadt, L.L.P.

(57) ABSTRACT

A semiconductor memory device is provided, including a memory cell array having a plurality of memory cells; an internal circuit having a function required in a storage operation of the memory cell array; a parameter storage unit configured to store a certain parameter and to have a storage place specified by a parameter address, the certain parameter designating an operation of the internal circuit; a command register configured to store a command instructing an operation of the internal circuit; and a converting circuit configured to adjust at least one of the parameter address and the command that differ between products or between standards to the internal circuit.

20 Claims, 12 Drawing Sheets

FIG. 10
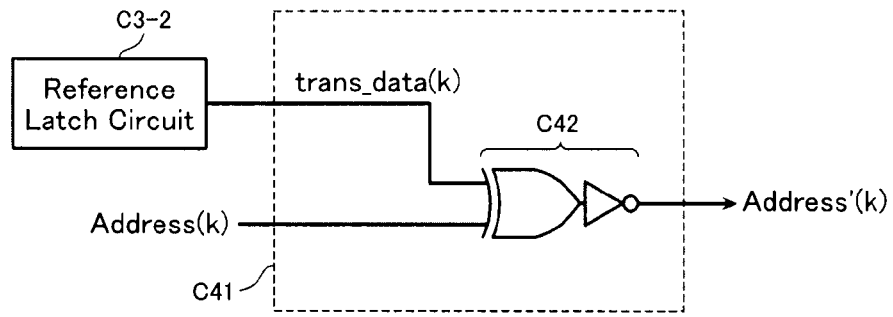
FIG. 11
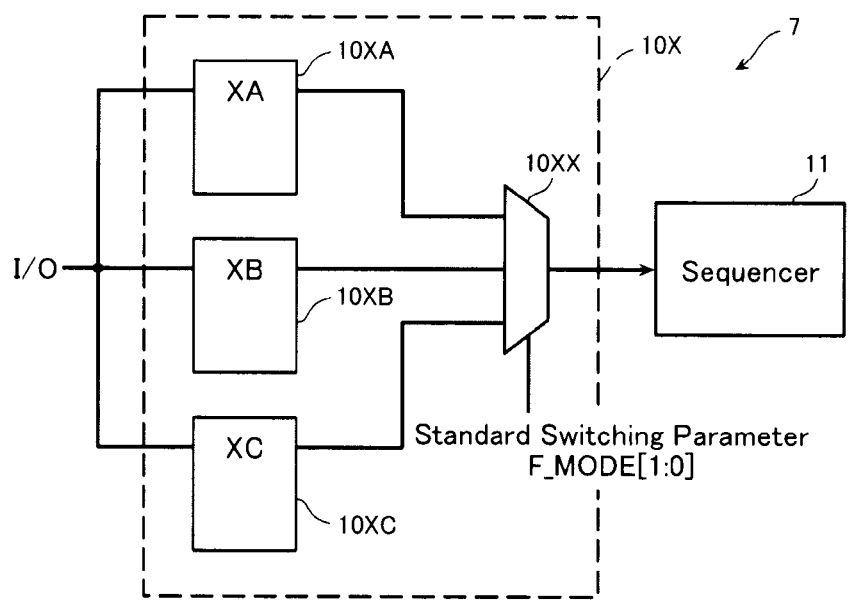
FIG. 12
|  | Parameter[1] | Parameter[0] |
|---|---|---|
| Standard A | 0 | 0 |
| Standard B | 0 | 1 |
| Standard C | 1 | 0 |

|  | Standard A | Standard B | Standard C |
|---|---|---|---|
| TEST-x | XAh | XBh | XCh |
| TEST-y | YAh | YBh | YCh |

|  | Standard A | Standard B |
|---|---|---|
| TEST-Y1 | YAh | YYh |
| TEST-Y2 | YYh | YBh |

SEMICONDUCTOR MEMORY DEVICE AND METHOD OF SETTING OPERATION ENVIRONMENT THEREIN

CROSS-REFERENCE TO RELATED APPLICATIONS

This application is based upon and claims the benefit of priority from the prior Japanese Patent Application No. 2011-065972, filed on Mar. 24, 2011, the entire contents of which are incorporated herein by reference.

FIELD

The embodiments described herein relate to a semiconductor memory device and a method of setting operation environment therein.

BACKGROUND

Description of the Related Art

A semiconductor memory device stores internally a plurality of parameters for performing various settings that accompany operation of the semiconductor memory device. Such parameters cover a wide range of settings, such as voltage settings, current settings, timer settings, operation systems, options, test modes, and so on, and are stored in a predetermined storage place. Moreover, precise control of semiconductor memory devices is required as a result of miniaturization of semiconductor memory devices, hence parameters for each of the settings are multiplying. It is therefore desirable for scrap-and-build or new additions of parameters to be performed for each generation of semiconductor memory device so that parameters are organized for each generation of semiconductor memory device.

In addition, with the principal aim of speeding up operations of semiconductor memory devices, various interface modes (for example, ONFI (Open NAND Flash Interface), Toggle, and so on) are proposed and being put into practical use as standards. With such various kinds of standards, a command corresponding to an equivalent operation sometimes differs according to the standard, and moreover the same command is sometimes allocated to a different operation.

As indicated above, the problem arises in semiconductor memory devices that parameters are changed according to generation and commands are not matched among standards.

BRIEF DESCRIPTION OF THE DRAWINGS

FIG. 10 is a schematic view showing one example of a configuration of an address compare circuit in the semiconductor memory device according to the same embodiment.

FIG. 11 is a schematic view showing one example of a configuration of a control circuit in a semiconductor memory device according to a fourth embodiment.

FIG. 12 is a view showing one example of a relationship between switching information and a plurality of test standards in a parameter latch circuit according to the same embodiment.

DETAILED DESCRIPTION

A semiconductor memory device according to an embodiment comprises: a memory cell array including a plurality of memory cells; an internal circuit having a function required in a storage operation of the memory cell array; a parameter storage unit configured to store a certain parameter and to have a storage place specified by a parameter address, the certain parameter designating an operation of the internal circuit; a command register configured to store a command instructing an operation of the internal circuit; and a converting circuit configured to adjust at least one of the parameter address and the command that differ between products or between standards to the internal circuit.

Embodiments are described below with reference to the accompanying drawings.

First Embodiment

[Overall Configuration]

Figure 1:
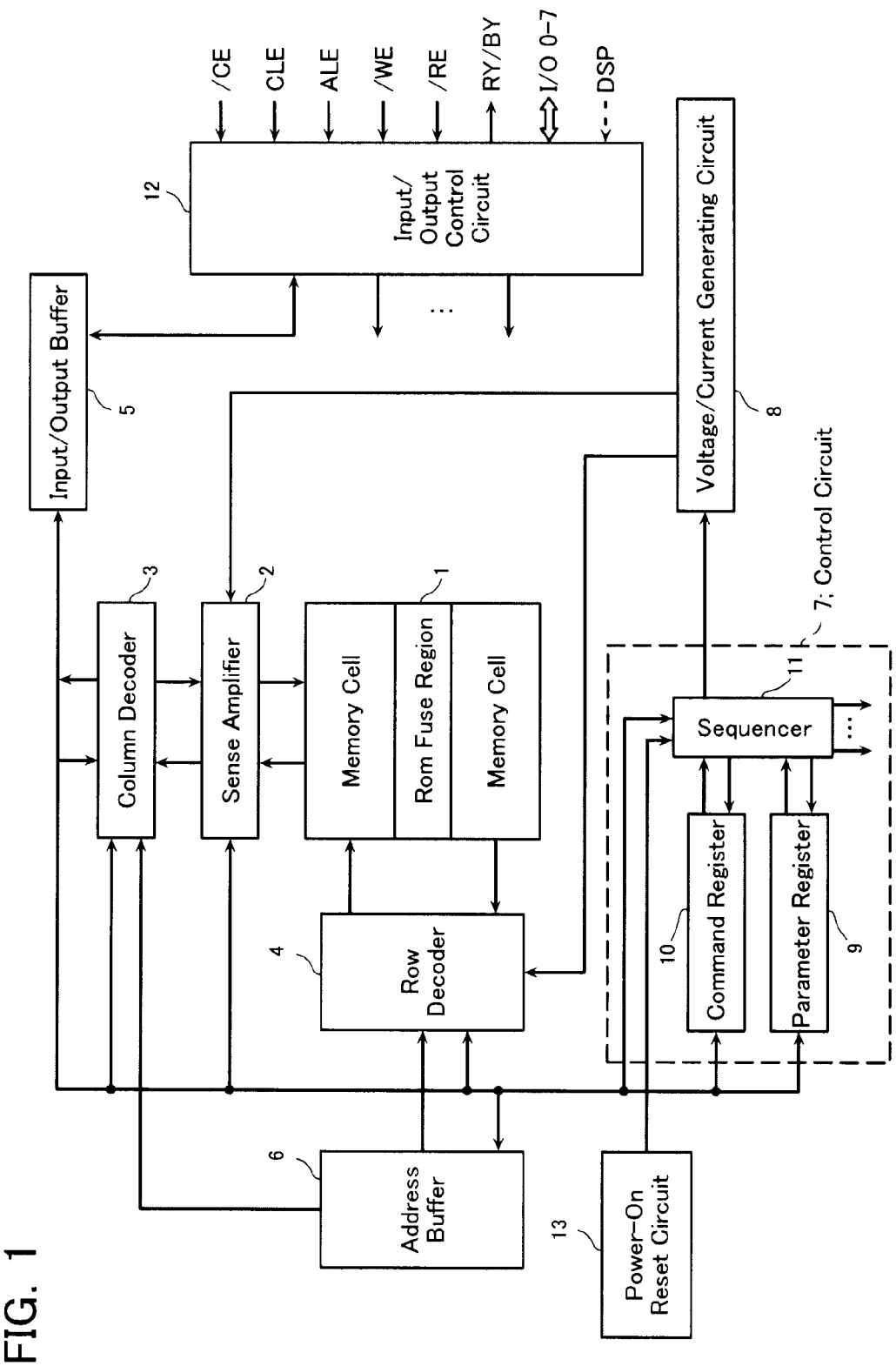
FIG. 1 is a block diagram showing a configuration of a semiconductor memory device according to a first embodiment.

FIG. 1 is a block diagram showing a configuration of a semiconductor memory device according to a first embodiment.

This semiconductor memory device comprises a memory cell array 1 having memory cells arranged in a matrix, such as a NAND flash memory, for example. Connected to bit lines BL of the memory cell array 1 are a sense amplifier 2 and a column decoder 3 which control the bit lines BL of the memory cell array 1 to perform data erase of the memory cells, data write to the memory cells, and data read from the memory cells. In addition, connected to word lines WL of the memory cell array 1 is a row decoder 4 which selects the word lines WL of the memory cell array 1 to apply voltages required in data erase of the memory cells, data write to the memory cells, and data read from the memory cells.

An input/output control circuit 12 is connected to a plurality of signal input pins, signal output pins, and data input/output pins I/O0-7. The signal input pins include command enable /CE, command latch enable CLE, address latch enable ALE, write enable /WE, and read enable /RE. In addition, the signal output pins include a ready/busy signal RY/BY. Note that in a certain standard such as Toggle for example, the input/output control circuit 12 sometimes also includes a data strobe pin DSP that instructs timing of data output.

A data input/output buffer 5 is connected to the input/output control circuit 12 to receive write data, to output read data, and to receive address data, command data and so on from/to the input/output control circuit 12. The data input/output buffer 5 sends write data received from the input/output control circuit 12 to the column decoder 3, and receives read data from the column decoder 3 and outputs this read data to external. Addresses supplied to the data input/output buffer 5 from the input/output control circuit 12 are sent to the column decoder 3 and the row decoder 4 via an address buffer 6. In addition, commands supplied to the data input/output buffer 5 from the input/output control circuit 12 are sent to a control circuit 7. The control circuit 7 receives an external control signal from external to judge whether data inputted to the data input/output buffer 5 is write data, a command, or an address, and, if the data is a command, receives the data and stores the data in a command register 10. The command register 10 outputs an instruction to a sequencer 11 according to the inputted command, and the sequencer 11 performs a certain sequence operation according to the inputted instruction. The sequencer 11 controls a voltage/current generating circuit 8 and other internal circuits. In response to this control, the voltage/current generating circuit 8 generates a voltage/current required in write, erase, and read operations, and outputs the voltage/current to various units such as the sense amplifier 2 and the row decoder 4.

A ROM Fuse region is provided in the memory cell array 1. This ROM Fuse region retains various parameters required to operate the semiconductor memory device. When using non-volatile semiconductor memory of the likes of NAND flash, part of the memory cell array 1 can be secured as a ROM Fuse. In contrast, when using volatile semiconductor memory of the likes of DRAM, information retained in the memory cell array 1 is lost when a power supply to the semiconductor memory device is turned off, hence the memory cell array 1 includes a melting type laser fuse as a ROM Fuse region.

When the power supply is turned on, the various kinds of setting values stored in the ROM Fuse region are read and stored in a parameter register (parameter storage unit) 9 provided in the control circuit 7. The parameter register 9 is operable also as a register capable of storing various kinds of parameters temporarily. For example, during development of a chip, a test mode may be used to set arbitrary parameters set in the parameter register 9 by a parameter set command mentioned later.

When the power supply is turned on, a power-on reset circuit 13 outputs a reset signal to perform initialization of the control circuit 7, and when the power supply is turned off, the power-on reset circuit 13 generates a shut down signal to perform a shut down operation to discontinue each of operations and prevent a high voltage remaining.

[Configuration of Control Circuit 7]

Figure 2:
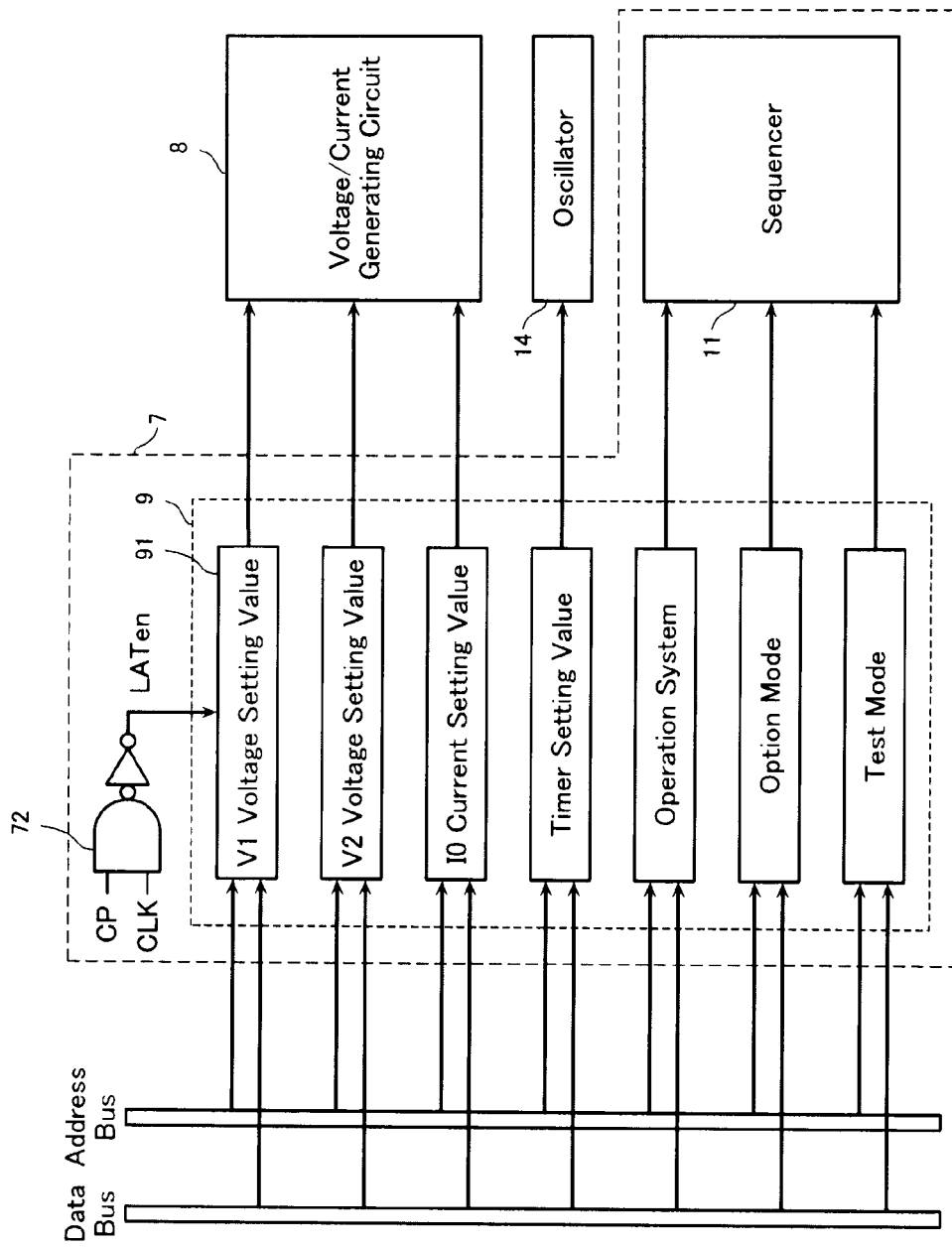
FIG. 2 is a schematic view showing a configuration of a parameter register in the semiconductor memory device according to the same embodiment.

FIG. 2 is a block diagram showing a configuration of the control circuit 7 and around the control circuit 7. The control circuit 7 includes, in addition to the sequencer 11 and the parameter register 9 previously mentioned, an AND circuit 72 for setting parameters in the parameter register 9.

The parameter register 9 is configured to include a plurality of parameter latch circuits 91. Parameters stored in these parameter latch circuits 91 have various purposes and include, specifically, setting values of various voltages, setting values of various currents, modes, multiple kinds of application-specific timer setting values, operation systems (methods of write, read, erase, and so on), option modes (settings of various options associated with the operation systems), test modes, and so on. These parameters are supplied to related internal circuits according to purpose of each of the parameters, for example, setting values of various kinds of voltage and current are supplied to the voltage/current generating circuit 8, timer setting values are supplied to an oscillator 14, operation systems, option modes, and test modes are supplied to the sequencer 11, and so on.

Normally, during start-up of the device, these parameters are transferred from the ROM Fuse region in the memory cell array 1. On the other hand, during test mode, the parameters need to be arbitrarily settable from external. Therefore, a data bus and an address bus are each connected to the parameter latch circuits 91 in the parameter register 9. The data bus transfers a value of the parameters, and the address bus designates an address of the parameter latch circuits 91 allocated in the parameter register 9 (parameter address). In addition, the AND circuit 72 included in the control circuit 7 is inputted with a clock signal CLK generated from the write enable signal /WE which is an input signal of the input/output control circuit 12, and with a parameter setting command CP to be mentioned later, and outputs a logical product of the clock signal CLK and the parameter setting command CP to the parameter register 9 as a latch signal LATen.

When the latch signal LATen is inputted to the parameter register 9 from the AND circuit 72, the parameter latch circuit 91 disposed at the address designated by an address signal Address inputted from the address bus is activated, and eight bits of parameter data conveyed by the data bus is imported into the activated parameter latch circuit 91.

Figure 3:
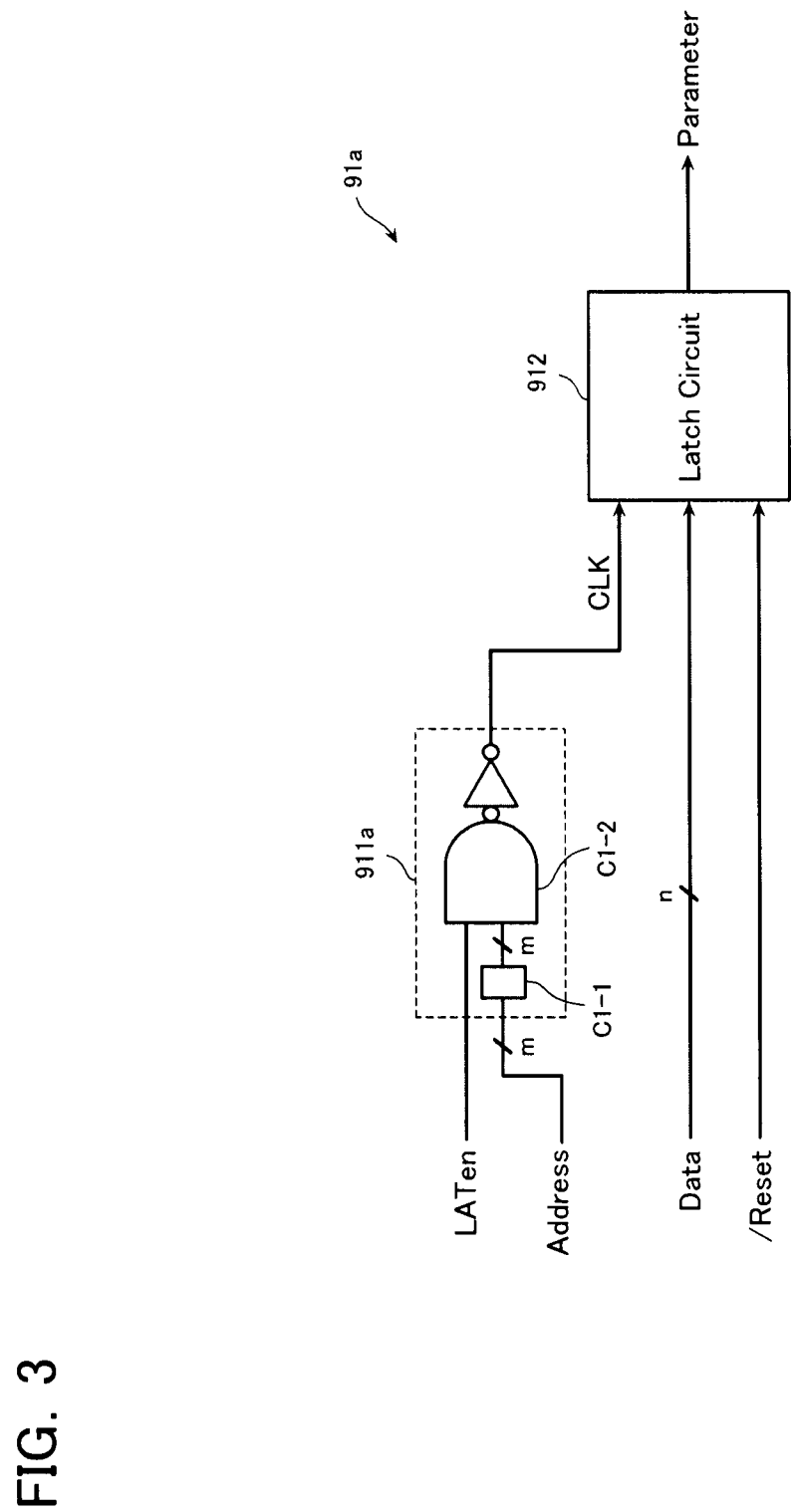
FIG. 3 is a schematic view showing one example of a configuration of part of the parameter register in the semiconductor memory device according to the same embodiment.
Figure 4:
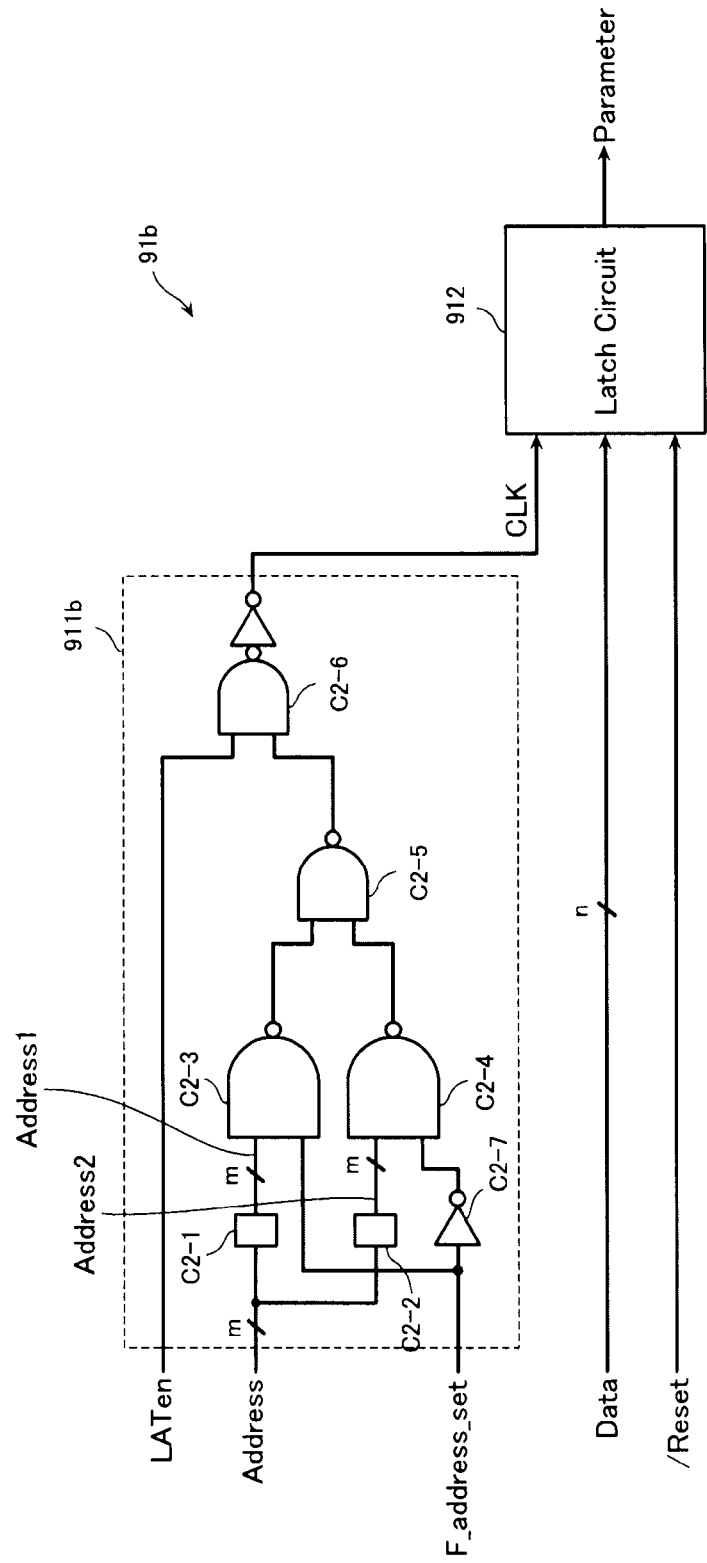
FIG. 4 is a schematic view showing one example of a configuration of part of the parameter register in the semiconductor memory device according to the same embodiment.

Specifically, the parameter latch circuit 91 is configured by a parameter latch circuit 91*a* shown in FIG. 3, or a parameter latch circuit 91*b* shown in FIG. 4. Of these, the parameter latch circuit 91*a* is activated when provided with one specific address, while the parameter latch circuit 91*b* is activated when provided with an address selected from two specific addresses. In the present embodiment, at least one of the plurality of parameter latch circuits 91 configuring the parameter register 9 is a parameter latch circuit 91*b*, and the parameter register 9 may be configured using only parameter latch circuits 91*b*.

FIG. 3 is a circuit diagram showing a configuration of the parameter latch circuit 91*a* in the semiconductor memory device according to the first embodiment. The parameter latch circuit 91*a* is configured to include an address decode circuit 911*a* and a latch circuit 912. The address decode circuit 911*a* is configured such that, when it is inputted with a certain pre-allocated m-bit address Address, m output bits of an address converter C1-1 all become "H", whereby the latch signal LATen is outputted from an AND circuit C1-2 as the clock signal CLK. The latch circuit 912 adopts the latch signal LATen outputted from the AND circuit C1-2 as the clock signal CLK to latch n-bit parameter data conveyed by the data bus. In addition, the latch circuit 912 is inputted with a reset signal formed by a logical sum of a reset signal outputted from the power-on reset circuit 13 and a reset signal generated during a resetting operation of the control circuit, and erases latched data according to this reset signal formed by the logical sum.

This parameter latch circuit 91a stores the parameter corresponding to one predetermined address. However, in a situation where parameters are continually being altered with progressive generations of semiconductor memory devices, if more flexibility can be given to allocation of parameters, then test program resources can be more effectively utilized.

FIG. 4 is a circuit diagram showing a configuration of the address-variable type parameter latch circuit 91b in the semiconductor memory device according to the first embodiment that provides such flexibility. The address-variable type parameter latch circuit 91b has an address decode circuit 91b operating as a converting circuit of the parameter address which differs from that of the parameter latch circuit 91a in FIG. 3. The latch circuit 912 has a similar configuration to the latch circuit 912 in the parameter latch circuit 91a.

The address decode circuit 911b is configured to include address converters C2-1 and C2-2 to which different addresses are respectively allocated, NAND circuits C2-3 to C2-5, an AND circuit C2-6, and a NOT circuit C2-7. The address converter C2-1 is configured such that, when an inputted m-bit address Address matches a pre-allocated m-bit first address Address1, m output bits all become "H". In addition, the address converter C2-2 is configured such that, when an inputted m-bit address Address matches a pre-allocated m-bit second address Address2, m output bits all become "H". Outputs of these address converters C2-1 and C2-2 are inputted to the NAND circuits C2-3 and C2-4, respectively.

Which of the two outputs of the NAND circuits C2-3 and C2-4 is to be made effective is selectable by an address select signal (switching information) F_address_set. That is, when the address select signal F_address_set is one (1), "H" is outputted from the NAND circuit C2-5 when the inputted address Address matches the first address Address1. On the other hand, when the address select signal F_address_set is zero (0), "H" is outputted from the NAND circuit C2-5 when the inputted address Address matches the second address Address2. In other cases, output of the NAND circuit C2-5 becomes "L". Moreover, the latch signal LATen is outputted from the AND circuit C2-6 only when "H" is outputted from the NAND circuit C2-5. The latch circuit 912 adopts this latch signal LATen as the clock signal CLK to latch the data.

[Operation]

Next, operation of the semiconductor memory device according to the present embodiment is described.

Figure 5:
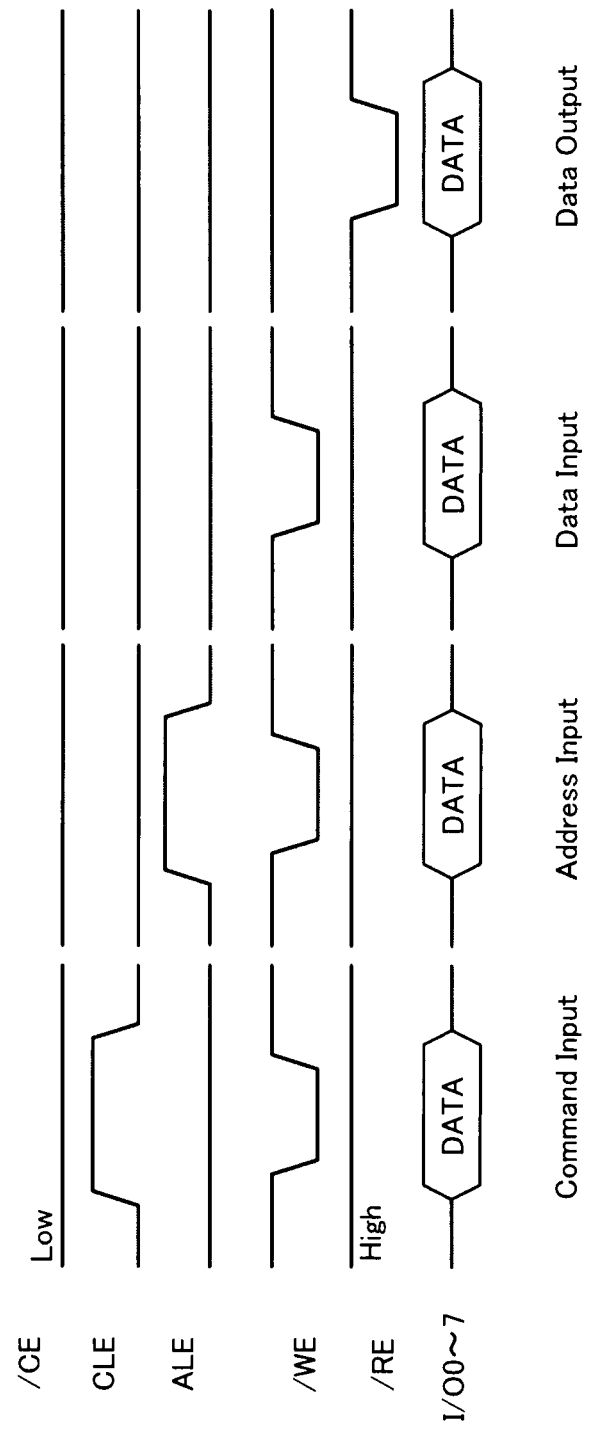
FIG. 5 is a time chart for explaining one example of an input system of data in the semiconductor memory device according to the same embodiment.

FIG. 5 shows signals inputted to input/output terminals of the input/output control circuit 12 in the semiconductor memory device according to the first embodiment. In FIG. 5, a waveform illustrated in the uppermost tier is the chip enable signal /CE, the second tier shows the command latch enable signal CLE, the third tier shows the address latch enable signal ALE, the fourth tier shows the write enable signal /WE, the fifth tier shows the read enable signal /RE, and the lowermost tier shows data inputted to a plurality of data input/output terminals IO0-7.

During command input, the chip enable signal /CE is set to "L" and the write enable signal /WE is lowered to "L" in a state where the command latch enable signal CLE is raised to "H". As a result of this operation, data inputted to the data input/output terminals IO0-7 is recognized as a command and imported to the command register 10 in the control circuit 7.

During address input, the chip enable signal /CE is set to "L" and the write enable signal /WE is lowered to "L" in a state where the address latch enable signal ALE is raised to "H". As a result of this operation, data inputted to the data input/output terminals IO0-7 is recognized as an address and imported to the address buffer 6.

During data input, the chip enable signal /CE is set to "L" and the write enable signal /WE is lowered to "L". As a result of this operation, data inputted to the data input/output terminals IO0-7 is recognized as data and transferred to the memory cell array 1, parameter register 9, and so on, according to an operation mode.

During data output, the chip enable signal /CE is set to "L" and the read enable signal /RE is lowered to "L". As a result of this operation, data is outputted from the data input/output terminals IO0-7.

Figure 6:
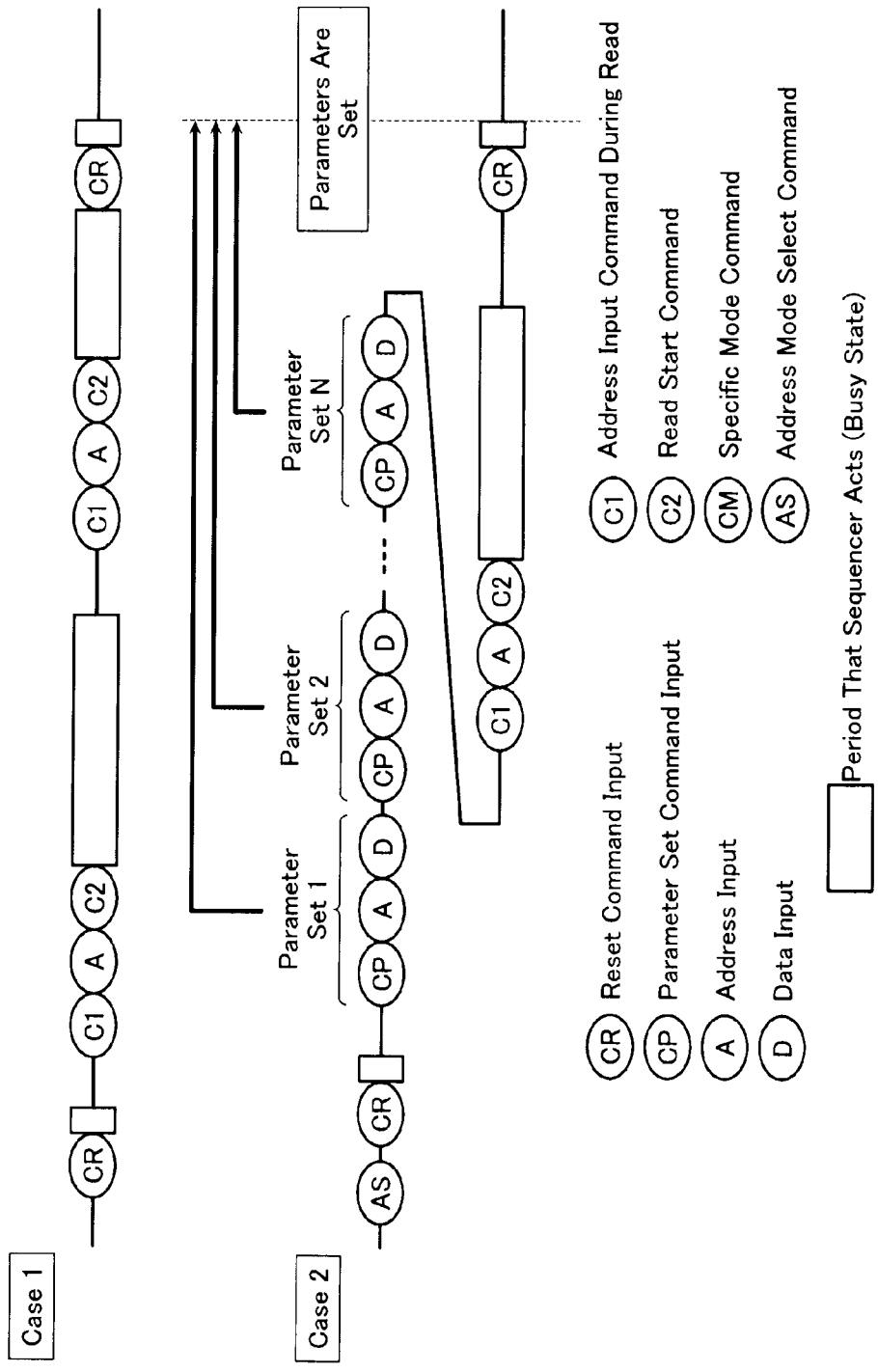
FIG. 6 is a view for explaining one example of an input system of data in the semiconductor memory device according to the same embodiment.

FIG. 6 is a time chart showing one example of a combination of signals inputted to the input/output control circuit 12 during operation of the semiconductor memory device according to the present embodiment. Case 1 shown in the upper tier of FIG. 6 shows an example of the case of use in user mode, and Case 2 shown in the lower tier of FIG. 6 shows an example of the case where test mode is used during development of the chip. Note that in FIG. 6, for the purpose of explanation, reset command input is shown as "CR", parameter set command input is shown as "CP", address input is shown as "A", data input is shown as "D", address input command input during read is shown as "C1", read start command input is shown as "C2", specific mode command is shown as "CM", and address select command for setting the address select signal F_address_set is shown as "AS". Note that for input of the reset command "CR", the parameter set command "CP", the address input command during read "C1", the read start command "C2", the specific mode command "CM", and the command "AS", it is only required to perform the operation of command input explained in FIG. 5.

In Case 1 (user mode), the reset command "CR" is inputted, and, in the case of read of data for example, the read command "C1", the address input "A", and the read start command "C2" are inputted sequentially whereby access to the semiconductor memory device for data read is started and a Busy state attained. This allows data stored at a designated address in the memory cell array 1 to be read. In Case 1, the read operation is re-performed and the reset command "CR" inputted.

In Case 2 (test mode), setting of the address select signal F_address_set and parameters is performed prior to write/read operations of the memory cell array 1. During setting of the address select signal F_address_set, the setting is performed by first inputting the command "AS". In parameter setting, the parameter set command "CP" is inputted, then the address input "A" and data input "D" are executed, whereby data of parameters is set in a pre-designated address in the parameter register 9. At this time, one of two kinds of addresses is allocated in the parameter latch circuit 91b according to the set address select signal F_address_set.

Note that in the present embodiment, setting of the address select signal F_address_set is performed by a command operation, but setting directly from external is also possible. After completion of setting of the various kinds of parameters, read/write of the semiconductor memory device is performed by operation similar to that in Case 1. Note that setting of parameters performed in Case 2 can be returned to the initial state by inputting the reset command "CR" after test completion.

Note that in the present embodiment, the reset command "CR" is inputted after performing setting of the address select signal F_address_set. Therefore, the semiconductor memory device according to the present embodiment must be configured such that setting of the address select signal F_address_set is not reset by the reset command. In addition, "AS" may also be inputted after the reset command "CR".

Such a configuration enables address assignment of a parameter latch to be altered without altering parameter addresses in a D/S (Die/Sort) program. Hence, the configuration according to the present embodiment allows parameters to be allocated to a desired address while effectively utilizing test resources, and allows usability of parameters to be improved while raising reliability of the test program.

Second Embodiment

Next, a semiconductor memory device according to a second embodiment is described. The semiconductor memory device according to the present embodiment is basically the same as the semiconductor memory device according to the first embodiment, but has a different configuration of the address decode circuit 911b.

Figure 7:
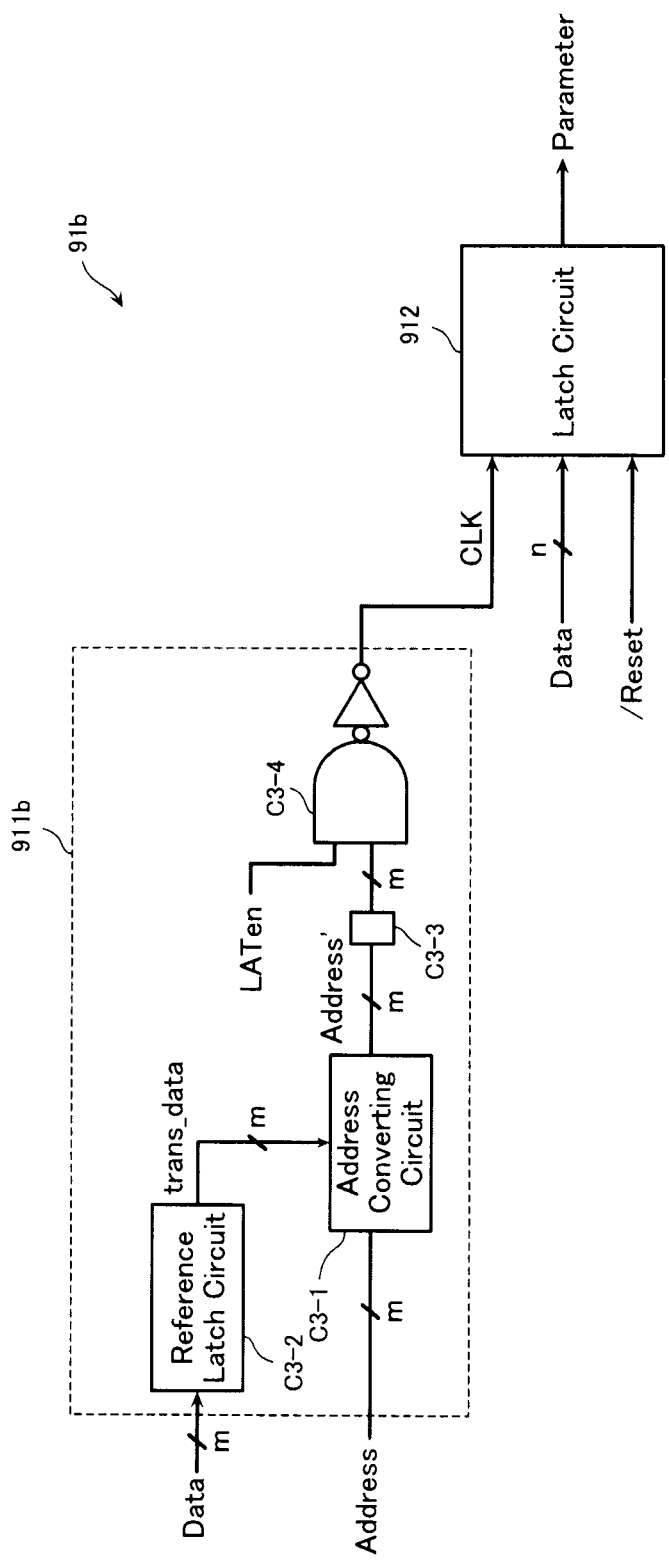
FIG. 7 is a schematic view showing one example of a configuration of a parameter register in a semiconductor memory device according to a second embodiment.

FIG. 7 is a circuit diagram showing a configuration of the address-variable latch circuit 91b in the semiconductor memory device according to the present embodiment. In the present embodiment, the address decode circuit 91b is configured to include an address converting circuit C3-1 connected to the address bus, a reference latch circuit C3-2 connected to the address converting circuit C3-1, an address converter C3-3 similarly connected to the address converting circuit C3-1, and an AND circuit C3-4 connected to the address converter C3-3.

In the previous embodiment, two kinds of address converters C2-1 and C2-2 were employed. However, the semiconductor memory device according to the present embodiment is configured such that one kind of address converter C3-3 is employed, and, by converting two different kinds of addresses into a common address in the address converting circuit C3-1 at a stage prior to the address converter C3-3, the two addresses are available to one address converter C3-3. That is, the address converting circuit C3-1 is inputted with an m-bit address signal Address, and selectively converts the address with reference to an m-bit signal trans_data from the reference latch circuit C3-2. The data trans_data provided from the reference latch circuit C3-2 enables any address Address to be converted to a pre-set address Address'. When the converted address Address' is the address pre-allocated by the address converter C3-3, all bits of the address converter C3-3 become "H". Regarding subsequent operation from the AND circuit C3-4 onwards, operation of the address-variable latch circuit 91b according to the present embodiment is similar to that of the parameter latch circuits 91a and 91b in the first embodiment described in FIGS. 3 and 4.

Figure 8:
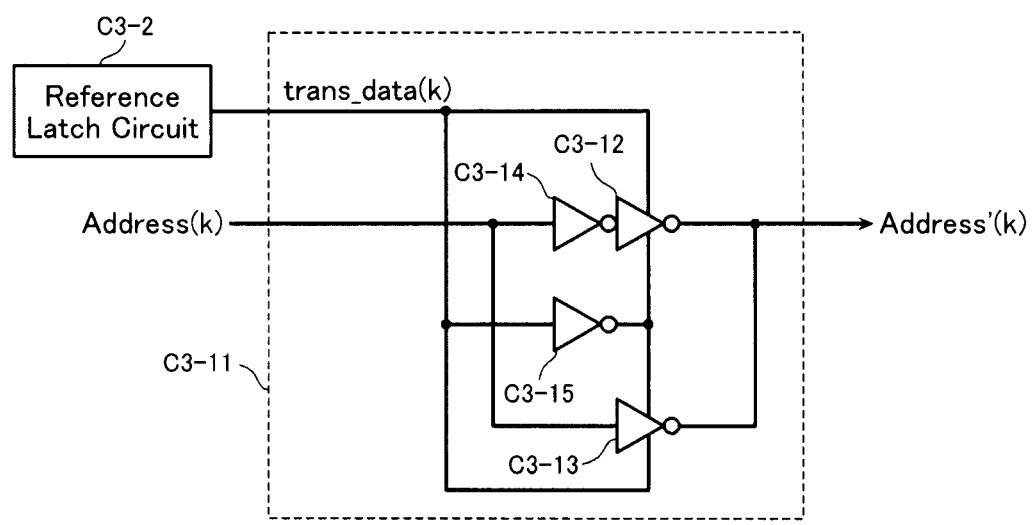
FIG. 8 is a schematic view showing one example of a configuration of an address converting circuit in the semiconductor memory device according to the same embodiment.

Note that the address converting circuit C3-1 is configured comprising an m-bit portion of address converting circuit elements C3-11 of the kind shown in FIG. 8, for example. Each of the address converting circuit elements C3-11 is configured from clocked inverters C3-12 and C3-13, and inverters C3-14 and C3-15. When data trans_data (k) outputted from the reference latch circuit C3-2 is "H", the address converting circuit element C3-11 has its clocked inverter C3-13 activated and thereby outputs the address Address' (k) which is the address Address inverted by the clocked inverter circuit C3-13, and when data trans_data (k) outputted from the reference latch circuit C3-2 is "L", the address converting circuit element C3-11 has its clocked inverter C3-12 activated and thereby outputs the address Address uninverted as the address Address' (k).

In the present embodiment, the address converting circuit C3-1 is configured having the same number m of address converting circuit elements C3-11 as there are bits in the address signal, but may have fewer than m address converting circuit elements C3-11. In addition, in the present embodiment, the reference latch circuit C3-2 is provided to each address decode circuit 911b. However, one reference latch circuit C3-2 may also be shared by a plurality of address decode circuits 911b.

In an initial state, "L" is latched in all bits of the reference latch circuit C3-2, and address bits are outputted uninverted. Note that in the present embodiment, the reference latch circuit C3-2 may also be configured as a circuit capable of being freely inputted from external. Importing data stored in the ROM Fuse region into the reference latch circuit C3-2 via the S/A, column decoder, and data bus also allows address allocation to be changed by setting address allocation in the ROM Fuse.

Such a configuration also allows similar advantages to those in the first embodiment to be obtained. Moreover, in this embodiment, a way of providing data in the reference latch circuit C3-2 allows any address to be changed to a designated address, thereby enabling a configuration having a higher degree of freedom to be obtained. Furthermore, in the case of a configuration of the kind where one reference latch circuit C3-2 is shared by a plurality of address decode circuits 911b, area of the address decode circuit 911b can be significantly suppressed.

Third Embodiment

Figure 9:
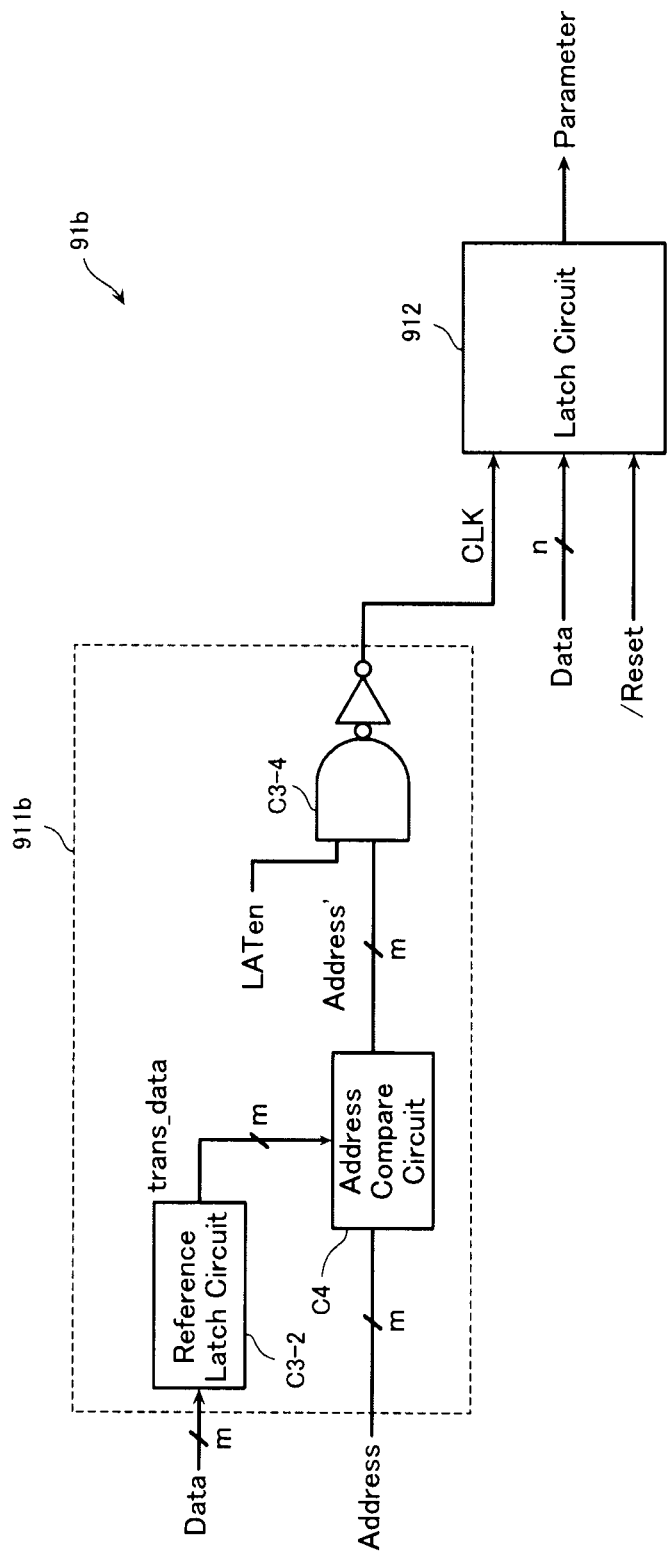
FIG. 9 is a schematic view showing one example of a configuration of a parameter register in a semiconductor memory device according to a third embodiment.

Next, a semiconductor memory device according to a third embodiment is described. A configuration of the address-variable latch circuit 91b in the semiconductor memory device according to the present embodiment is shown in FIG. 9. Portions having the same configuration as those in FIG. 7 are assigned with identical symbols to those in FIG. 7, and a description thereof is omitted. The semiconductor memory device according to the present embodiment is basically the same as the semiconductor memory device according to the second embodiment, but differs in including an address compare circuit C4 as an address converting circuit and in not including the address converter C3-3 of the second embodiment.

In the second embodiment, address bits to be switched by the address converting circuit C3-1 were stored in the reference latch circuit C3-2. In contrast, in the present embodiment, address data is stored in the reference latch circuit C3-2, and, when an address signal Address inputted from the address bus and address data stored in the reference latch circuit C3-2 are matched, the address compare circuit C4 outputs "H". When the address signal and the address data are matched in all bits, the clock signal CLK is outputted to the latch circuit 912 according to the latch signal LATen.

FIG. 10 is a circuit diagram showing an address compare circuit element C41 which is a part of the configuration of the address compare circuit C4. The address compare circuit C4 includes the same number m of address compare circuit elements C41 as there are bits in the address. FIG. 10 shows a configuration of the k-th of the m address compare circuit elements C41. A terminal of a single bit portion of the address bus and the reference latch circuit C3-2 are connected to the address compare circuit element C41.

The address compare circuit element C41 is configured comprising an EX-NOR circuit C42 which has its input terminals inputted with data trans_data(k) stored in the reference latch circuit C3-2 and with an address signal Address(k)

from the address bus, and which outputs "H" when the address data and the address signal are matched and "L" when the address data and the address signal are not matched.

Such a configuration also allows similar advantages to those in the first embodiment to be obtained. Moreover, configuring the reference latch circuit C3-2 to be programmable allows any address to be allocated to any address-variable parameter latch circuit 91b.

Fourth Embodiment

Next, a semiconductor memory device according to a fourth embodiment is described. Although the embodiments described above have been related to input/output of the parameter register 9, the present embodiment relates to input/output of the command register 10. That is, the present embodiment realizes a configuration adaptable to commands differ by standards.

FIG. 11 is a circuit diagram showing a configuration of part of the control circuit 7 in the semiconductor memory device according to the present embodiment.

The command register 10 includes command register elements 10X. The number of command register elements 10X corresponding to the number of operations caused by commands. Each of the command register elements 10X is configured to include a plurality of command registers 10XA-10XC and a switching circuit (command converting circuit) 10XX. The command registers 10XA-10XC are inputted with command codes outputted from the input/output buffer 5, and activate a control signal when commands XAh, XBh, and XCh are respectively inputted. The switching circuit 10XX is inputted with a standard-switching parameter F_MODE[1:0], and selectively outputs the control signal from the command registers 10XA-10XC to the sequencer 11, according to the standard-switching parameter (switching information) F_MODE[1:0]. More specifically, the switching circuit 10XX selects the control signal from the command register 10XA when for example [0:0] is inputted in the standard-switching parameter F_MODE[1:0], selects the control signal from the command register 10XB when for example [0:1] is inputted in the standard-switching parameter F_MODE[1:0], and selects the control signal from the command register 10XC when for example [1:0] is inputted in the standard-switching parameter F_MODE[1:0]. One example of a relation between each of parameters [1] and [0] of this standard-switching parameter F_MODE[1:0] and standards A, B, and C is shown in FIG. 12.

Figures 13, 14, 15:
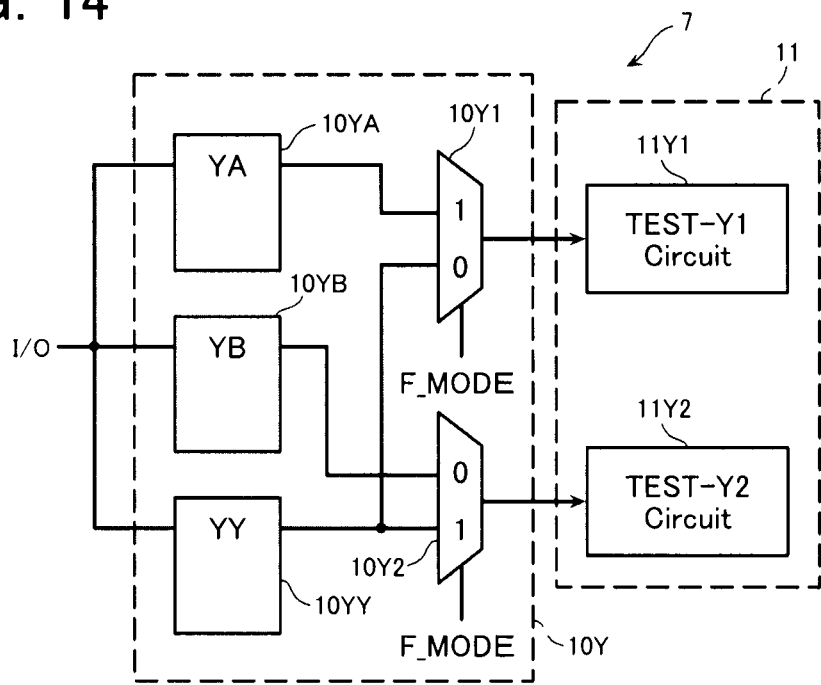
FIG. 13 is a view showing a command corresponding to a number of kinds of test patterns in the plurality of test standards.
FIG. 14 is a schematic view showing one example of a configuration of a control circuit in a semiconductor memory device according to a fifth embodiment.
FIG. 15 is a view showing a command corresponding to a number of kinds of test patterns in the plurality of test standards.

Next, operation of the control circuit 7 according to the present embodiment is described. FIG. 13 is a figure showing commands corresponding respectively to several kinds of test parameters TEST-x and TEST-y in a plurality of standards A-C. According to the example in FIG. 13, the command for performing test pattern TEST-x is XAh in standard A, XBh in standard B, and XCh in standard C, and the command for performing test pattern TEST-y is YAh in standard A, YBh in standard B, and YCh in standard C. For example, in the case of executing test pattern TEST-x in test standard B, of command registers XA, XB, and XC, only the control signal from the command register XB is activated when command XBh is inputted. Next, [0:1] is inputted as the standard-switching parameter F_MODE, and activated the control signal from the command register 10XB is transmitted to the sequencer 11 performing the test pattern TEST-x.

Therefore, in the present embodiment, providing command registers 10XA-C appropriate to the number of standards to be handled makes it possible to handle commands that differ for each standard. The standard-switching parameter F_MODE is stored in advance in the ROM Fuse region, and may be configured to be stored in the parameter register 9 during start-up, or may be configured to be set in the parameter register 9 from external as in the previous embodiment.

Note that the parameter register shown in the first through third embodiments may also be employed as the parameter register 9 in the present embodiment.

Fifth Embodiment

Next, a semiconductor memory device according to a fifth embodiment is described. Whereas the fourth embodiment showed an example where commands for executing an identical operation differ for each standard, the present embodiment shows a configurative example handling the case where operations for an identical command differ for each standard.

FIG. 14 is a circuit diagram showing a configuration of the control circuit 7 in the semiconductor memory device according to the present embodiment. A command register element 10Y comprises a plurality of command registers 10YA, 10YB, and 10YY, and select circuits 10Y1 and 10Y2. The command registers 10YA, 10YB, and 10YY are inputted with and command codes outputted from the input/output buffer 5, and activate a control signal when commands YAh, YBh, and YCh are respectively inputted. The select circuit 10Y1 selectively outputs control signal from the command registers 10YA and 10YY to a TEST-Y1 circuit 11Y1 in the sequencer 11, according to the standard-switching parameter F_MODE. Similarly, the select circuit 10Y2 selectively outputs control signal from the command registers 10YB and 10YY to a TEST-Y2 circuit 11Y2 in the sequencer 11, according to the standard-switching parameter F_MODE.

FIG. 15 is a figure showing a relationship between test patterns TEST-Y1 and TEST-Y2 and commands for executing these test patterns TEST-Y1 and TEST-Y2, respectively, in standards A and B, similarly to FIG. 13. In the example in FIG. 15, the command for performing test pattern TEST-Y1 is YAh in standard A, and YYh in standard B, and the command for performing test pattern TEST-Y2 is YYh in standard A, and YBh in standard B. Therefore, the command for performing TEST-Y2 in standard A and the command for performing TEST-Y1 in standard B are identical.

In the present embodiment, when the command register element 10Y corresponds to, for example, standard A, the standard-switching parameter F_MODE is assumed to be "1", and the control signal outputted from the command register YA is selected by the select circuit 10Y1 and the control signal outputted from the command register YY is selected by the select circuit 10Y2. Moreover, when the command register element 10Y corresponds to standard B, the standard-switching parameter F_MODE is assumed to be "0", and the control signal outputted from the command register YY is selected by the select circuit 10Y1 and control signal outputted from the command register YB is selected by the select circuit 10Y2. This enables compatibility of semiconductor memory device according to the present embodiment with each standard. The standard-switching parameter F_MODE may be stored in advance in the ROM Fuse region, and stored in the parameter register 9 during start-up, or may be set in the parameter register 9 directory from external, similarly to in the fourth embodiment.

Note that the parameter register 9 shown in the first through third embodiments may also be employed as the parameter register 9 in the present embodiment.

Sixth Embodiment

Figure 16:
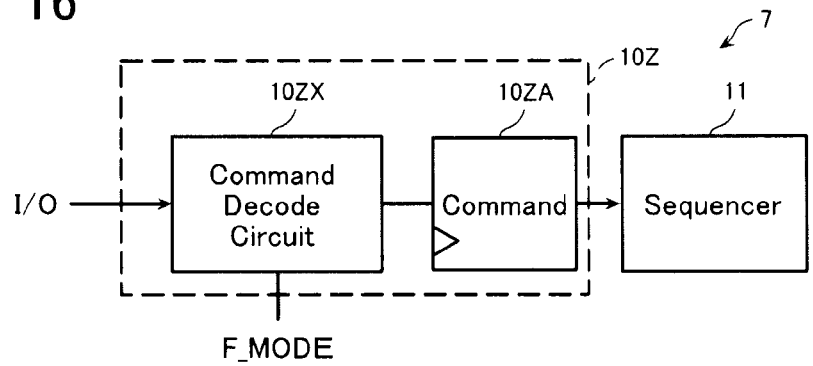
FIG. 16 is a schematic view showing one example of a configuration of a control circuit in a semiconductor memory device according to a sixth embodiment.

Next, a semiconductor memory device according to a sixth embodiment is described. FIG. 16 is a circuit diagram showing a configuration of the control circuit 7 in the semiconductor memory device according to the present embodiment. A command register element 10Z comprises a command decode circuit 10ZX and a command register 10ZA. The command decode circuit 10ZX converts a command code outputted from the input/output buffer 5 to a certain common command code, according to the standard-switching parameter F_MODE. The command register 10ZA is inputted with and decodes the common command outputted from the command decode circuit 10ZX. In addition, the command register 10ZA outputs an activated control signal to the sequencer 11.

A configuration such as in the present embodiment allows similar advantages to those in the fourth and fifth embodiments to be obtained. Moreover, the configuration such as in the present embodiment makes it possible to suppress the number of command registers compared to in the fourth and fifth embodiments, hence enables area of the command register 10 to be significantly reduced.

Note that the parameter register 9 shown in the first through third embodiments may also be employed as the parameter register 9 in the present embodiment.

Seventh Embodiment

Figure 17:
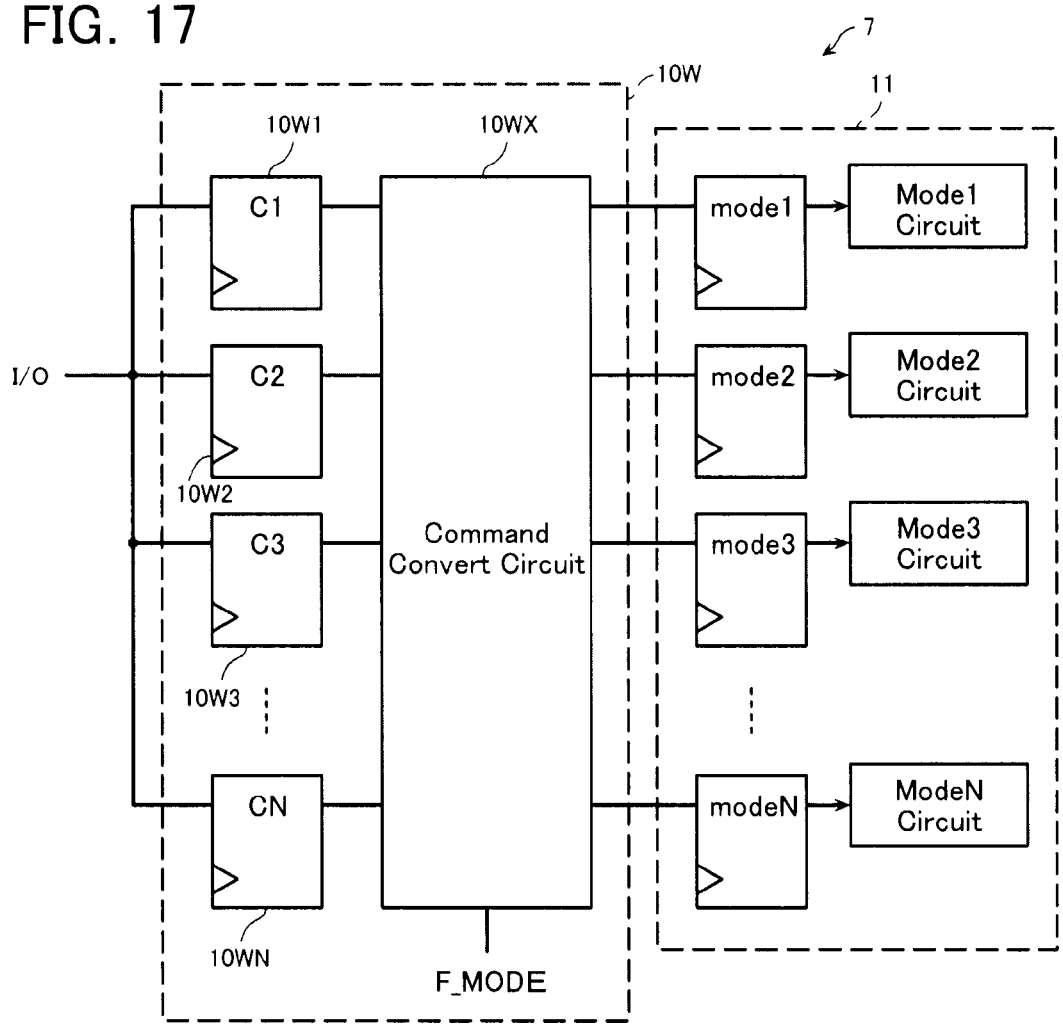
FIG. 17 is a schematic view showing one example of a configuration of a control circuit in a semiconductor memory device according to a seventh embodiment.

Next, a semiconductor memory device according to a seventh embodiment is described. FIG. 17 is a circuit diagram showing a configuration of the control circuit 7 according to the present embodiment. A command register element 10W comprises a plurality of command registers 10W1-10WN and a command convert circuit 10WX. The command registers 10W1-10WN are inputted with command codes outputted from the input/output buffer 5 and latch these commands. In addition, the command convert circuit 10WX converts the commands latched in the command registers 10W1-10WN according to the standard-switching parameter F_MODE, and outputs the converted commands to the sequencer 11. The sequencer 11 inputs the converted commands in command registers (internal command registers) model-N and test circuits Model-N, and thereby drives a corresponding operation circuit Modek.

In the command register element 10W, a plurality of commands corresponding to a plurality of standards are controlled in a batch by the command convert circuit 10WX. This command convert circuit 10WX may have a way of decoding programmed from external, and inputting a command table from external allows compatibility with any kind of command code allocation.

Note that the parameter register 9 shown in the first through third embodiments may also be used as the parameter register 9 in the present embodiment.

[Other]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
 a memory cell array including a plurality of memory cells;
 an internal circuit having a function required in a storage operation of the memory cell array;
 a parameter storage unit configured to store a certain parameter and to have a storage place specified by a parameter address, the certain parameter designating an operation of the internal circuit;
 a command register configured to store a command instructing the operation of the internal circuit; and
 a converting circuit configured to switch at least one of a correspondence relationship between the parameter address and the storage place in the parameter storage unit and a correspondence relationship between a command and a function corresponding to the command based on a setting of the converting circuit, the parameter address and the command differing between generations of products or between standards of interface modes.

2. The semiconductor memory device according to claim 1, wherein the converting circuit includes an address decode circuit for switching the correspondence relationship between the parameter address and the storage place in the parameter storage unit based on switching information.

3. The semiconductor memory device according to claim 1, wherein the converting circuit includes an address decode circuit comprising a reference latch circuit configured to store switching information and an address converting circuit configured to switch the correspondence relationship between the parameter address and the storage place in the parameter storage unit based on the switching information stored in the reference latch circuit.

4. The semiconductor memory device according to claim 1, wherein the converting circuit includes an address decode circuit comprising a reference latch circuit configured to store address data and an address compare circuit configured to compare a parameter address stored in the reference latch circuit and a parameter address inputted from an address bus.

5. The semiconductor memory device according to claim 4, wherein the reference latch circuit is configured to be programmable.

6. The semiconductor memory device according to claim 1, wherein the converting circuit includes a command converting circuit configured to select a control signal based on switching information and to output the control signal, the control signal realizing one function on a command that differs between standards of interface modes.

7. The semiconductor memory device according to claim 6, wherein
 the command register includes at least one command register element, a number of the command register elements corresponding to a number of operations due to commands, and
 the command converting circuit selectively outputs the control signal from the at least one command register element according to the switching information.

8. The semiconductor memory device according to claim 6, wherein the command converting circuit converts the command inputted to the command converting circuit to a command adjusted to the internal circuit based on the switching information.

9. The semiconductor memory device according to claim 6, wherein the command converting circuit is capable of programming a method of decode from external.

10. The semiconductor memory device according to claim 1, wherein the converting circuit includes a command converting circuit for selecting a control signal based on switching information and outputting the control signal, the control signal realizing functions that differ between standards of interface modes.

11. The semiconductor memory device according to claim 1, wherein the converting circuit includes an internal command register provided in addition to the command register and corresponding to the operation of the internal circuit, and a command decode circuit configured to relate a correspondence between the command register and the internal command register.

12. A method of setting operation environment in a semiconductor memory device, the semiconductor memory device including a memory cell array including a plurality of memory cells, an internal circuit having a function required in a storage operation of the memory cell array, a parameter storage unit configured to store a certain parameter designating an operation of the internal circuit and to have a storage place specified by a parameter address, and a command register configured to store a command instructing the operation of the internal circuit, the method of setting operation environment comprising:
inputting a command to provide switching information from external, the switching information corresponding to a generation of a product or a standard of an interface mode and being used for switching at least one of a correspondence relationship between the parameter address and the storage place in the parameter storage unit and a correspondence relationship between the command and a function corresponding to the command based on a setting of the converting circuit, the parameter address and the command differing between generations of products or between standards of interface modes.

13. The method of setting operation environment in a semiconductor memory device according to claim 12, wherein setting due to input of the command to provide switching information is not reset by a reset command for returning the certain parameter set to any value to an initial state.

14. The method of setting operation environment in a semiconductor memory device according to claim 12, wherein the command to provide switching information is inputted after a reset command for returning the certain parameter set to any value to an initial state.

15. A semiconductor memory device, comprising:
a memory cell array including a plurality of memory cells;
an internal circuit having a function required in a storage operation of the memory cell array;
a storage unit configured to store operation information related to an operation of the internal circuit; and
a converting circuit configured to, during input to the storage unit or during output from the storage unit, selectively switch a correspondence relationship between the operation information and the operation of the internal circuit based on a setting of the converting circuit.

16. The semiconductor memory device according to claim 15, wherein
the operation information is a certain parameter designating an operation of the internal circuit,
the storage unit is a parameter storage unit configured to store the parameter and to have a storage place specified by a parameter address, and
the converting circuit includes an address decode circuit configured to switch a correspondence relationship between the parameter address and the parameter storage unit based on switching information.

17. The semiconductor memory device according to claim 15, wherein
the operation information is a certain parameter designating an operation of the internal circuit,
the storage unit is a parameter storage unit configured to store the parameter and to have a storage place specified by a parameter address, and
the converting circuit includes an address decode circuit comprising a reference latch circuit configured to store an address select signal as switching information and an address converting circuit configured to switch a correspondence relationship between the parameter address and the storage place in the parameter storage unit based on the address select signal stored in the reference latch circuit.

18. The semiconductor memory device according to claim 15, wherein
the operation information is a command instructing an operation of the internal circuit,
the storage unit is a command register configured to store the command, and
the converting circuit includes a command converting circuit configured to select a control signal based on switching information and outputting the control signal, the control signal realizing one function on a command that differs between standards of interface modes.

19. The semiconductor memory device according to claim 15, wherein
the operation information is a command instructing an operation of the internal circuit,
the storage unit is a command register for storing the command, and
the converting circuit includes a command converting circuit configured to select a control signal based on switching information and to output the control signal, the control signal realizing functions that differ between standards of interface modes.

20. The semiconductor memory device according to claim 15, wherein
the operation information is a command instructing an operation of the internal circuit,
the storage unit is a command register configured to store the command, and
the converting circuit includes an internal command register provided in addition to the command register and corresponding to the operation of the internal circuit, and a command decode circuit configured to relate a correspondence between the command register and the internal command register.

* * * * *